(12) United States Patent
Jia et al.

(10) Patent No.: US 9,933,672 B2
(45) Date of Patent: Apr. 3, 2018

(54) DISPLAY PANEL AND MANUFACTURING METHOD THEREOF, DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Weihua Jia, Beijing (CN); Peng Jiang, Beijing (CN); Haipeng Yang, Beijing (CN); Jaikwang Kim, Beijing (CN); Yong Jun Yoon, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/906,095

(22) PCT Filed: Jun. 15, 2015

(86) PCT No.: PCT/CN2015/081416
§ 371 (c)(1),
(2) Date: Jan. 19, 2016

(87) PCT Pub. No.: WO2016/107093
PCT Pub. Date: Jul. 7, 2016

(65) Prior Publication Data
US 2016/0327841 A1 Nov. 10, 2016

(30) Foreign Application Priority Data

Dec. 31, 2014 (CN) .......................... 2014 1 0850811

(51) Int. Cl.
*G02F 1/1345* (2006.01)
*G02F 1/1333* (2006.01)
(Continued)

(52) U.S. Cl.
CPC ........ *G02F 1/136204* (2013.01); *G02F 1/133* (2013.01); *G02F 1/136* (2013.01);
(Continued)

(58) Field of Classification Search
CPC ........... G02F 1/134309; G02F 1/13439; G02F 1/134363; G02F 1/1345; G02F 1/13452
(Continued)

(56) References Cited

U.S. PATENT DOCUMENTS

2005/0146666 A1* 7/2005 Hatta .................... G02F 1/1362
349/138
2005/0185105 A1* 8/2005 Miyachi ................. C09K 19/02
349/24

(Continued)

FOREIGN PATENT DOCUMENTS

CN 101271238 A 9/2008
CN 102053415 A 5/2011
(Continued)

OTHER PUBLICATIONS

International Search Report 7 Written Opinion Appln. No. PCT/CN2015/081416; dated Oct. 10, 2015.
(Continued)

*Primary Examiner* — Kimberly Rizkallah
*Assistant Examiner* — Brian Turner
(74) *Attorney, Agent, or Firm* — Ladas & Parry LLP; Loren K. Thompson (57) ABSTRACT

A display panel and manufacturing method thereof, and a display device are disclosed. The display panel includes an array substrate and a counter substrate. The array substrate (Continued)

includes a main region and a peripheral region, the main region coincides with an orthographical projection of the counter substrate on the array substrate, and at least one glue dispensing zone is arranged in the peripheral region or the main region. Conductive adhesive is provided in the glue dispensing zone, and is electrically connected to a grounded unit; an electrostatic conducting structure is provided on the counter substrate, and the conductive adhesive is electrically connected to the electrostatic conducting structure.

21 Claims, 5 Drawing Sheets

(51) Int. Cl.
  *G02F 1/1339* (2006.01)
  *G02F 1/1362* (2006.01)
  *G02F 1/133* (2006.01)
  *G02F 1/136* (2006.01)
  *G02F 1/1368* (2006.01)
  *H01L 23/544* (2006.01)
  *H01L 23/60* (2006.01)
  *H01L 27/02* (2006.01)
  *H01L 27/12* (2006.01)

(52) U.S. Cl.
  CPC ...... *G02F 1/1368* (2013.01); *G02F 1/136209* (2013.01); *G02F 1/136286* (2013.01); *H01L 23/544* (2013.01); *H01L 23/60* (2013.01); *H01L 27/0292* (2013.01); *H01L 27/0296* (2013.01); *H01L 27/124* (2013.01); *H01L 27/1259* (2013.01); *H01L 2223/5442* (2013.01); *H01L 2223/54426* (2013.01); *H01L 2223/54486* (2013.01)

(58) Field of Classification Search
  USPC .............. 257/59, 72, 88, 787, 788; 438/155; 349/150, 151, 152, 153, 154, 155
  See application file for complete search history.

(56) References Cited

U.S. PATENT DOCUMENTS

| | | | |
|---|---|---|---|
| 2007/0040286 A1* | 2/2007 | Liu ....................... | H01L 23/544 257/797 |
| 2007/0063355 A1* | 3/2007 | Ueno ................... | H05K 3/0032 257/787 |
| 2007/0187844 A1* | 8/2007 | Chen ..................... | H01L 23/041 257/789 |
| 2009/0059141 A1* | 3/2009 | Nagasawa ............. | G02F 1/1333 349/111 |
| 2009/0103034 A1* | 4/2009 | Asada ................... | G02F 1/1345 349/139 |
| 2010/0079694 A1* | 4/2010 | Yoshida ............ | G02F 1/134363 349/40 |
| 2011/0032624 A1* | 2/2011 | Bolis ..................... | B81B 3/0021 359/666 |
| 2011/0102719 A1 | 5/2011 | Kakehi et al. | |

FOREIGN PATENT DOCUMENTS

| | | |
|---|---|---|
| CN | 102929051 A | 2/2013 |
| CN | 203191661 U | 9/2013 |
| CN | 103513459 A | 1/2014 |
| CN | 203480784 U | 3/2014 |
| CN | 104460070 A | 3/2015 |
| JP | 2001-156417 A | 6/2001 |
| JP | 2009-282285 A | 12/2009 |

OTHER PUBLICATIONS

First Chinese Office Action dated Oct. 8, 2016; Appln. No. 201410850811.0.

The Second Chinese Office Action dated Apr. 14, 2017; Appln. No. 201410850811.0.

The Third Chinese Office Action dated Sep. 30, 2017; Appln. 201410850811.0.

* cited by examiner

DISPLAY PANEL AND MANUFACTURING METHOD THEREOF, DISPLAY DEVICE

TECHNICAL FIELD

At least one embodiment of the present disclosure relates to a display panel and manufacturing method thereof, and a display device.

BACKGROUND

A liquid crystal display device includes an array substrate and a counter substrate (e.g., a color filter substrate) disposed opposite to each other, and a liquid crystal layer disposed between the array substrate and the counter substrate. In the liquid crystal display device, orientation of liquid crystal molecules is controlled by applying of voltages to a common electrode and a pixel electrode, and in turn, light rays are controlled.

Generally, in the process of manufacture, production, assembly, testing, storage or transportation of a liquid crystal display device, it is easy to generate static electricity on the liquid crystal display device because of friction, or due to the electrical connection, static electricity in air, human body or other charged object, static electricity will be transferred to the liquid crystal display device. A substrate (e.g., a counter substrate or an array substrate) of the liquid crystal display device is made of an insulating material such as glass or the like, and the eliminating rate of static electricity is very slow. Thus, when accumulation of static electricity on a surface of the substrate occurs, the static electricity will not be accumulated on the surface of the substrate for a long time only if there is a proper releasing route. When electrostatic discharge takes place because of great accumulative static electricity, a display module, a driver and so on of the liquid crystal display device will be damaged by static electricity due to undue electric stress. For example, the following cases may happen: screen defects are produced, metal circuitry is molten or evaporated, resistance value of elements is changed, an oxide layer is damaged or broken down, and so on.

In order to lead out the static electricity on a substrate surface of the liquid crystal display device in time, so as to avoid the occurrence of such a case that static electricity builds up in the substrate surface of the liquid crystal display device and electrostatic damage results, the static electricity may be conducted out to a metal frame of the liquid crystal display device in the way of attaching an electrically conductive adhesive tape to the peripheries of the liquid crystal display device.

SUMMARY

According to at least one embodiment of the disclosure, there is provided a display panel and manufacturing method thereof, a display device, so that the timely lead-out of static electricity on a counter substrate in the display panel is realized to avoid the electrostatic damage and the cost is reduced.

According to at least one embodiment of the disclosure, there is provided a display panel, which includes an array substrate and a counter substrate disposed oppositely, the array substrate includes a main region and a peripheral region, the main region coincides with an orthographical projection of the counter substrate on the array substrate, at least one glue dispensing zone is arranged in the peripheral region or the main region, and conductive adhesive is provided in the glue dispensing zone and is electrically connected to a grounded unit; an electrostatic conducting structure is provided on the counter substrate, and the conductive adhesive is electrically connected to the electrostatic conducting structure.

According to at least one embodiment of the disclosure, there is further provided a display device, which includes the above display panel.

According to at least one embodiment of the disclosure, there is further provided a manufacturing method of a display panel, which includes: forming a counter substrate, wherein an electrostatic conducting structure is provided on the counter substrate; forming an array substrate, wherein the array substrate includes a main region and a peripheral region, the main region coincides with the orthographic projection of the counter substrate on the array substrate, and at least one glue dispensing zone is arranged in the peripheral region or the main region; cell-assembling the array substrate and the counter substrate; and dripping conductive adhesive in the glue dispensing zone, so that the electrostatic conducting structure and a grounded unit in the display panel are electrically connected by the conductive adhesive.

BRIEF DESCRIPTION OF THE DRAWINGS

In order to illustrate the technical solution of the embodiments of the disclosure more clearly, the drawings of the embodiments will be briefly introduced below; it is obvious that the drawings as described below are only related to some embodiments of the disclosure, but are not limitative of the disclosure.

DETAILED DESCRIPTION

In order to make objects, technical details and advantages of the embodiments of the disclosure apparent, hereinafter, the technical solutions of the embodiments of the disclosure will be described in a clearly and fully understandable way in connection with the drawings related to the embodiments of the disclosure. It is obvious that the described embodiments are just a part but not all of the embodiments of the disclosure. Based on the described embodiments of the disclosure, those ordinarily skilled in the art can obtain other embodiment(s), without any inventive work, which come(s) into the scope sought for protection by the disclosure.

Unless otherwise defined, the technical terminology or scientific terminology used in the present disclosure should have the same meaning as commonly understood by one of ordinary skill in the art to which this disclosure belongs. "First", "second" and the like used in the present disclosure do not show any order, number or importance, but are only used to distinguish different constituent parts. Likewise, a term "a," "an," or the like does not indicate limitation in number, but specifies the presence of at least one. A term "comprises," "comprising," "includes," "including", "contains" or the like means that an element or article ahead of this term encompasses element(s) or article(s) listed behind this term and its(their) equivalents, but does not preclude the presence of other elements or articles. A term "connection," "connected," or the like is not limited to physical or mechanical connection, but can include electrical connection, whether directly or indirectly. "Upper," "lower," "left," "right" or the like is only used to describe a relative positional relationship, and when an absolute position of the described object is changed, the relative positional relationship might also be changed accordingly.

In the study, it has been noticed by inventors of the present application that, the mode that output of static electricity to a metal frame is achieved by using an electrically conductive adhesive tape is not suitable for a display device with a plastic frame, and the electrically conductive adhesive tape has a high material cost and requires manual operation, so that the automation cannot be achieved. Moreover, regarding how to achieve the output of static electricity on a counter substrate, there is no better way at present.

According to embodiments of the disclosure, there are provided a display panel and manufacturing method thereof, a display device. The display panel includes an array substrate and a counter substrate disposed oppositely, and a grounded unit; the array substrate includes a main region that coincides with the orthographic projection of the counter substrate on the array substrate and a peripheral region. At least one glue dispensing zone is arranged in the peripheral region or the main region, and conductive adhesive electrically connected to the grounded unit is provided in the glue dispensing zone. An electrostatic conducting structure is provided on the counter substrate, and the conductive adhesive is electrically connected to the electrostatic conducting structure. In embodiments of the disclosure, by means of arranging a glue dispensing zone in a peripheral region or a main region of the array substrate, providing conductive adhesive in the glue dispensing region and allowing it to be electrically connected to an electrostatic conducting structure on a counter substrate, the static electricity on the counter substrate can be conducted out to the conductive adhesive within the glue dispensing zone, and then conducted out to the grounded unit, and consequently, the static electricity on the counter substrate can be conducted out timely, avoiding electrostatic damage. In embodiments of the disclosure, by means of arranging a glue dispensing zone in a peripheral region of the array substrate, it can be realized that conductive adhesive is dripped into the glue dispensing zone with an automatic glue dispensing equipment, and as compared with the mode in which an electrically conductive adhesive tape is manually attached, the material cost and labor cost can be saved, and the production efficiency is enhanced.

It is to be noted that, in embodiments of the disclosure, the conductive adhesive is a kind of adhesive that has certain conductive property after it is solidified or dried, and its constituent components mainly include a matrix resin, conductive particles, a dispersing additive, an adjuvant and the like in general. In the conductive adhesive, conductive particles are bonded together with the aid of adhering action of the matrix resin, so as to form a conductive path, and thus electrical connection of a stuck material is realized. Additionally, embodiments of the disclosure are not limited to the positional and connecting relationships between a grounded unit and an array substrate or a counter substrate, any component in the display panel that is usable for conducting static electricity on conductive adhesive out of the conductive adhesive can be used as the grounded unit in embodiments of the disclosure.

Embodiments of the disclosure are suitable for a variety of display panels such as liquid crystal display panels, OLED (Organic Light Emitting Diode) display panels and so on, and in the following embodiments, a liquid crystal display panel will be mainly described as an example.

The package manner of liquid crystal display panels can include COG (chip on glass, i.e., a chip and a glass substrate are interconnected with a conductor), COB (chip on board, i.e., a naked chip is directly connected to a printed circuit board with a wire), COF (chip on film, i.e., a chip is mounted on a thin film), etc., and GOA (gate driver on array) or other mode may be used as the gate driving manner of the liquid crystal display device.

Figure 1A:
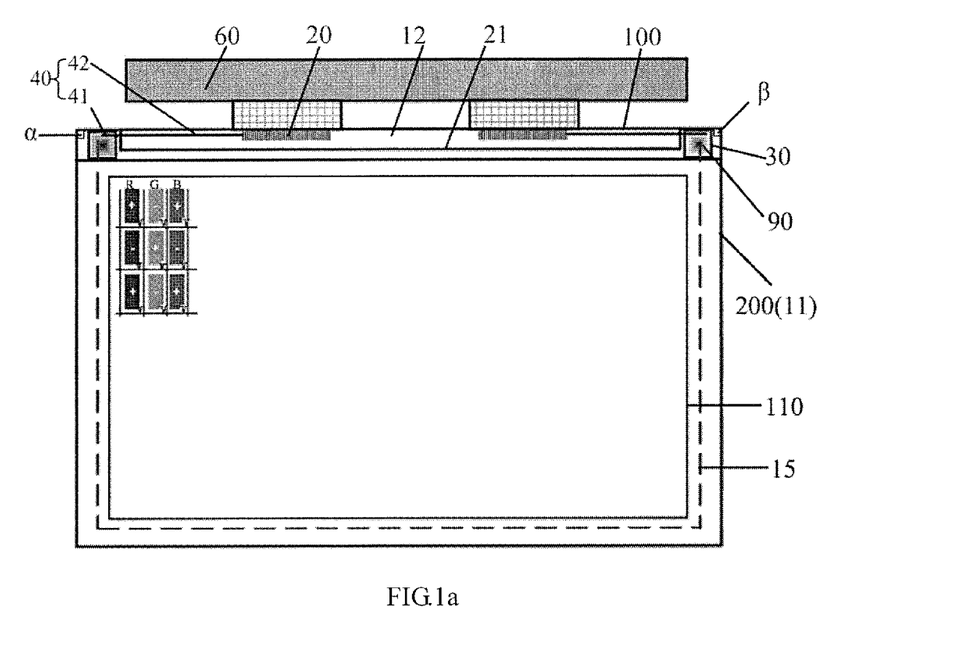
FIG. 1a is a schematic top view illustrating a display panel in GOA mode provided by an embodiment of the disclosure.
Figure 1B:
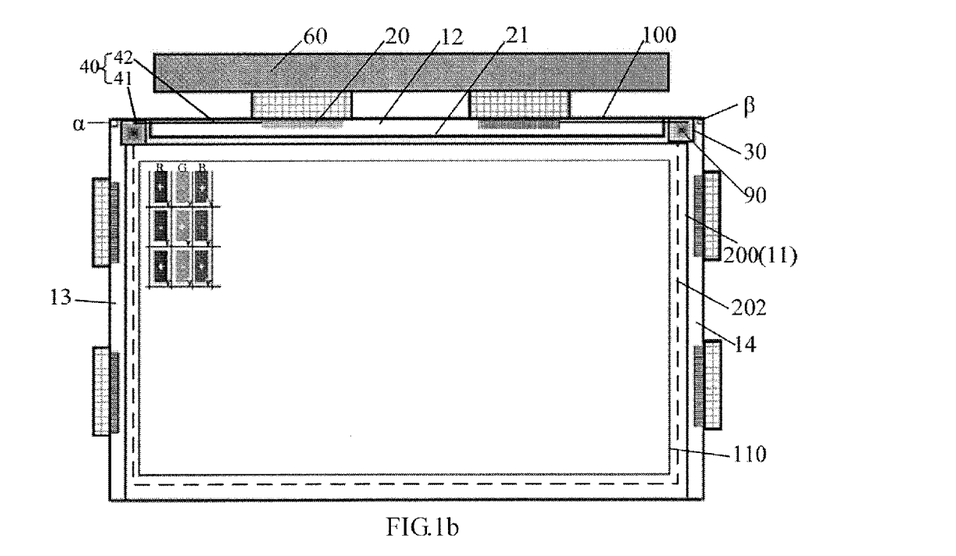
FIG. 1b is a schematic top view illustrating a display panel in COF mode provided by an embodiment of the disclosure.

FIG. 1*a* is a schematic top view illustrating a display panel in GOA mode provided by an embodiment of the disclosure; and FIG. 1*b* is a schematic top view illustrating a display panel in COF mode provided by an embodiment of the disclosure. Hereinafter, display panels as shown in FIG. 1*a* and FIG. 1*b* will be described as examples.

According to at least one embodiment of the disclosure, there is provided a display panel, as shown in FIG. 1*a* and FIG. 1*b*, which includes an array substrate 100 and a counter substrate 200 disposed oppositely, and a grounded unit (e.g., a printed circuit board 60). The array substrate 100 includes a main region 11 and a peripheral region 12. The main region 11 coincides with the orthographic projection of the counter substrate 200 on the array substrate 100, and hence, the peripheral region 12 is a zone of the array substrate 100 extending beyond the counter substrate 200 along the direction of the plane on which it is located. At least one glue dispensing region 30 is arranged in the peripheral region 12 (two glue dispensing regions are illustrated in FIG. 1*a* and FIG. 1*b*, respectively), and conductive adhesive 90 is provided in the glue dispensing region 30, and electrically connected to a grounded unit (e.g., a printed circuit board 60). An electrostatic conducting structure (e.g., a first wiring 202 in FIG. 1*b*) is provided on the counter substrate 200, and the conductive adhesive 90 is electrically connected to the electrostatic conducting structure.

For example, the counter substrate 200 may be a color filter substrate, on which a black matrix, a color filter layer and other film layers are provided, and the color filter layer usually includes a plurality of red sub-pixels R, a plurality of green sub-pixels G, and a plurality of blue sub-pixels B. A portion of sub-pixels of the counter substrate are shown in FIG. 1a and FIG. 1b. Based on different directions in an electric field for driving liquid crystals, liquid crystal display panels can be classified into a vertical electric field type, such as Twisted Nematic (TN) mode, and the like, and a horizontal electric field type, such as In Plane Switching (IPS) mode, Advanced Super Dimension Switch (ADS) mode, and the like. In a vertical electric field type liquid crystal display panel, pixel electrodes and common electrodes are formed in an array substrate and a counter substrate, respectively; in a horizontal electric field type liquid crystal display panel, pixel electrodes and common electrodes are formed in the array substrate altogether.

In order to guide static electricity on the counter substrate to the conductive adhesive, it is required that an electrostatic conducting structure be provided on the counter substrate. By means of adjusting the dripping amount of the conductive adhesive into the glue dispensing region, the conductive adhesive can be electrically connected to the electrostatic conducting structure, and thus static electricity on the counter substrate is guided to the conductive adhesive.

Figure 2A:
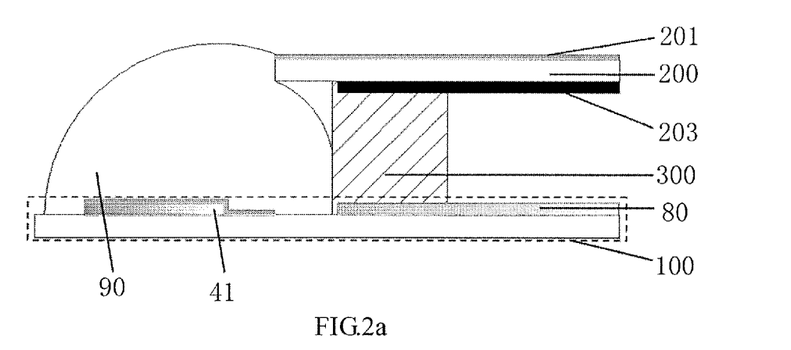
FIG. 2a is a schematic partial section view illustrating a display panel provided by an embodiment of the disclosure.

In a liquid crystal display panel in a horizontal electric field control mode, common electrodes and pixel electrodes that are useful for supplying voltages so as to drive liquid crystals to deflect are each arranged in an array substrate, and thus no electrode is provided on a counter substrate so as to play a protective role for liquid crystal molecules. When a charged object (e.g., a human body) contacts with the liquid crystal display panel from the side on which the counter substrate is located, static electricity on the charged object can be transferred to the liquid crystal display panel, thereby affecting orientation of liquid crystal molecules. Thus, the display effect of pictures is affected. In this case, it is possible that, by means of providing a transparent conductive layer on a side of the counter substrate far away from the array substrate and allowing it to be grounded, external signals are shielded, so that an electric field within a liquid crystal cell is assured to be uniform, and the quality and reliability of products are guaranteed. Thus, as for a horizontal electric field type liquid crystal display panel, static electricity on the counter substrate can be guided to the conductive adhesive with the aid of the transparent conductive layer on a side of the counter substrate far away from the array substrate. That is, the electrostatic conducting structure in the above embodiment of the disclosure may be a transparent conductive layer 201 on a side of a counter substrate 200 far away from an array substrate 100, as shown in FIG. 2a. For example, the transparent conductive layer 201 may be made of a transparent metal oxide such as indium zinc oxide, indium tin oxide, indium gallium zinc oxide or the like.

With respect to a display panel in which no transparent conductive layer is provided on a side of a counter substrate far away from an array substrate, such as a vertical electric field type liquid crystal display panel, the electrostatic conducting structure may be designed to be a wiring on a periphery of the counter substrate. For example, as shown in FIG. 1b, the electrostatic conducting structure on the counter substrate 200 is a first wiring 202 surrounding the periphery of the counter substrate 200. For example, the first wiring 202 may be situated outside a display region 110, and the first wiring 202 may be located on a side of the counter substrate 200 facing an array substrate 100 (as shown in FIG. 1b) or be located on a side of the counter substrate 200 far away from the array substrate 100.

It is to be noted that, the first wiring surrounding (or disposed on) the periphery of the counter substrate means that the first wiring may be arranged in the zone where at least one side of the counter substrate is located. Illustration has been given in FIG. 1b merely with reference to an example in which a first wiring is arranged in the zone where three sides of a counter substrate are located; embodiments of the disclosure include but is not limited to this configuration.

For example, when the first wiring is disposed on a side of a counter substrate facing an array substrate, a glue dispensing zone may be arranged in the main region of the array substrate. In this case, conductive adhesive may be set in the glue dispensing zone manually, so that the conductive adhesive is electrically connected to the first wiring.

Figure 2B:
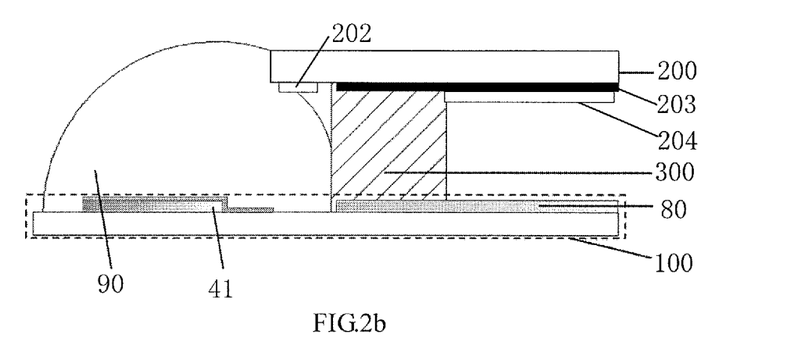
FIG. 2b is a schematic partial section view illustrating another display panel provided by an embodiment of the disclosure.

In at least one embodiment, the first wiring may be disposed in the same layer as an electrode on a counter substrate, so that the first wiring and the electrode can be simultaneously formed in the same patterning process, and then the process flow is simplified. For example, in a vertical electric field type liquid crystal display panel, as shown in FIG. 2b, a common electrode 204 and a first wiring 202 are provided on a side of the counter substrate 200 facing an array substrate 100, and thus, the common electrode 204 and the first wiring 202 can be formed while the common electrode is formed. For example, as for an embedded touch display panel, touch electrodes (e.g., touch sensing electrodes) are usually provided on a counter substrate. For example, with respect to an on-cell touch display panel, touch electrodes are disposed on a side of a counter substrate far away from an array substrate, and with respect to an in-cell touch display panel, touch electrodes are disposed on a side of a counter substrate facing an array substrate. Thus, the first wiring can be formed while touch electrodes are formed.

Because an electrode on a counter substrate is usually made of a transparent conductive material, the material for a first wiring 202 that is formed simultaneously with the electrode is also the transparent conductive material, such as indium zinc oxide, indium tin oxide, indium gallium zinc oxide or other transparent metal oxide. Certainly, the first wiring 202 may not be formed simultaneously with a transparent electrode on a counter substrate, either, and in this case, the first wiring 202 may also be made of a metallic material.

It is to be noted that, in order to illustrate embodiments of the disclosure more clearly, structures such as a color filter layer, a planarizing layer and the like on the counter substrate 200 are not shown in FIG. 2b.

At the same time when static electricity on the counter substrate 200 is conducted out, in the display panel provided by embodiments of the disclosure, static electricity on the array substrate may also be conducted out to a certain extent in such a manner that part of static electricity on the array substrate is guided to the conductive adhesive 90 and afterward it is further conducted out to a grounded unit. For example, a gate signal line, a data signal line and other signal line situated in the main region 11 may be electrically connected to the conductive adhesive 90 by an electrostatic ring or other structure that is commonly used by those ordinary artisans in the related art. For example, in at least one embodiment, as shown in FIG. 1a, on the array substrate 100, there may also be provided a second wiring 15 surrounding its periphery, and the second wiring 15 may be electrically connected to conductive adhesive or electrically connected to a printed circuit board 60 through an electrode pin. For example, in FIG. 1*a*, the second wiring 15 is situated outside the display region 110, and head end and tail end of the second wiring 15 are each located in the glue dispensing zone 30 so as to be electrically connected to the conductive adhesive 90. For example, the second wiring 15 may be formed simultaneously with a gate signal line in the main region of the array substrate, so as to simplify the process flow. The embodiment of the disclosure is more favorable to the output of static electricity on the array substrate by means of electrically connecting the second wiring to the grounded unit through conductive adhesive or an electrode pin.

It is to be noted that, FIG. 1*a* was illustrated with reference to an example in which a GOA mode is adopted, and when a COF mode is adopted, it is also possible for a second wiring on an array substrate to utilize a wiring on a COF (flexible circuit film) to stride across the COF zone. In addition, that the array substrate 100 may be further provided with a second wiring 15 surrounding its periphery refers to that the second wiring may be arranged in a zone where at least one side of the array substrate is located. FIG. 1*a* was merely presented with reference to an example in which the second wiring is arranged in a zone where three sides of the array substrate are located; but embodiments of the disclosure include are not limited to this configuration.

In at least one embodiment, conductive adhesive 90 may be electrically connected to a grounded unit through an electrostatic lead-out line 40, and in this case, the electrostatic lead-out line 40 may include a portion situated in a glue dispensing zone 30 and electrically connected to the conductive adhesive 90, and include a portion 42 situated outside the glue dispensing zone 30 and electrically connected to the grounded unit. As shown in FIG. 1*a* and FIG. 1*b*, a printed circuit board 60 is disposed on a data-signal input side of the array substrate 100, and an end of a signal line disposed on the array substrate 100 is connected to the printed circuit board 60 through an electrode pin 20. It is to be noted that, the connecting relationship between the signal line and the electrode pin is not shown in FIG. 1*a* and FIG. 1*b*. Because the printed circuit board 60 is set to be grounded, in at least one embodiment, the grounded unit may be a printed circuit board 60. Namely, in this case, the conductive adhesive 90 may be electrically connected to the printed circuit board 60 through an electrostatic lead-out line 40, which includes a portion 41 situated in a glue dispensing zone 30 and electrically connected to the conductive adhesive 90, and include a portion 42 situated outside the glue dispensing zone 30 and electrically connected to a grounded unit (the printed circuit board 60).

In an embodiment of the disclosure, conductive adhesive 90 may be dripped into a glue dispensing zone 30 by an automatic glue-dispensing equipment. Owing to the action of surface tension, the conductive adhesive 90 is formed into an ellipse shape and infiltrated into a portion 41 of an electrostatic lead-out line 40 situated in a glue-dispensing zone 30, and the electric connection between the conductive adhesive 90 and the portion 41 of the electrostatic lead-out line 40 situated in the glue-dispensing zone 30 is realized. Thus, the static electricity on the conductive adhesive 90 can be conducted out to a printed circuit board 60 through the electrostatic lead-out line 40.

Figure 3A:
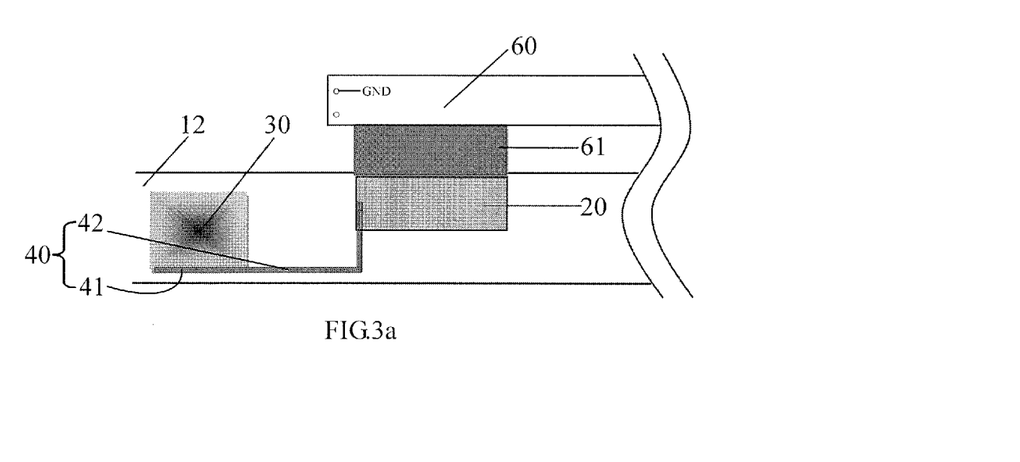
FIG. 3a is a schematic top view illustrating the electrical connection of conductive adhesive to a printed circuit board through an electrostatic lead-out line, provided by an embodiment of the disclosure.

FIG. 3*a* is a schematic structure view illustrating the electrical connection of conductive adhesive to a printed circuit board through an electrostatic lead-out line, provided by an embodiment of the disclosure; and, FIG. 3*a* will be presented with reference to an example in which a COF mode is adopted by the display panel. As shown in FIG. 3*a*, between an electrode pin 20 and a printed circuit board 60, there is provided a flexible circuit thin film 61, in which a flexible circuit board is used as a carrier for a packaging chip, and the chip is bonded with the flexible circuit board. During package, the flexible circuit thin film 61 is bent, so that the printed circuit board 60 can be located on a side of the array substrate far away from the counter substrate, and after that, a package frame (e.g., a metal frame or a plastic frame) is used for fixing the counter substrate and the array substrate. In embodiments of the disclosure, because conductive adhesive 90 is electrically connected to the printed circuit board 60 through an electrostatic lead-out line 40, the static electricity in the liquid crystal display panel can be released by the printed circuit board even if the liquid crystal display panel is packaged with a plastic frame.

Figure 3B:
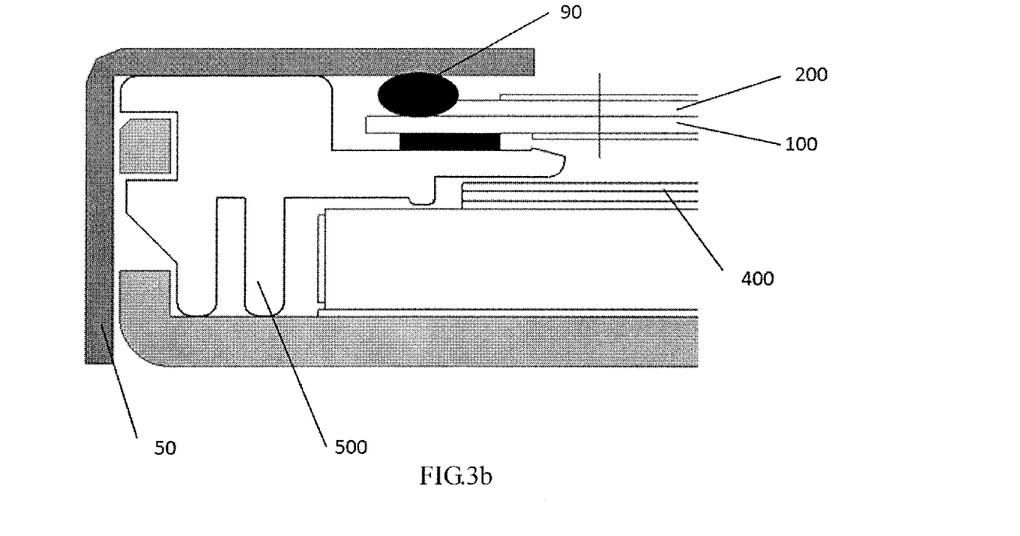
FIG. 3b is a schematic structure view illustrating the contact of conductive adhesive with a surface of a metal frame, provided by an embodiment of the disclosure.

Additionally, when the liquid crystal display panel adopts a metal frame, the grounded unit may be a metal frame as well. FIG. 3*b* is a schematic structure view illustrating the contact of conductive adhesive with a surface of a metal frame, provided by an embodiment of the disclosure. As shown in FIG. 3*b*, a counter substrate 200 and an array substrate 100 are fixed by a holder 500 and a metal frame 50 after they are cell-assembled together, and by means of controlling the amount of conductive adhesive dripped into a glue-dispensing zone of the array substrate, the conductive adhesive 90 can be made to contact a surface of the metal frame 50 so as to achieve the electrical connection between the conductive adhesive 90 and the metal frame 50. Consequently, the static electricity on the conductive adhesive 90 can be conducted out to the metal frame 50. In FIG. 3*b*, a backlight source 400 may also be provided on a side of the array substrate 100 far away from the counter substrate 200, so as to provide the liquid crystal display panel with backlight.

It is to be noted that, in embodiments of the disclosure, based on the different kinds of packaging manners or driving manners of the liquid crystal display panels, the number of a peripheral regions included by the array substrate also varies. For example, the display panel shown in FIG. 1 adopts a GOA mode, and one cutting line of its array substrate 100 extends out of a cutting line of a counter substrate 200 in correspondence with it, namely, the array substrate 100 includes one peripheral region 12. Certainly, the array substrate 100 may include a plurality of peripheral regions as well. For example, the display panel shown in FIG. 1*b* adopts a COF mode, and a bilateral gate drive configuration is adopted for its array substrate 100, and thus, the array substrate 100 includes three peripheral regions 12, 13 and 14. A glue dispensing zone 30 may be situated in at least one of the three peripheral regions and the combination thereof.

In at least one embodiment, a glue dispensing zone 30 may be disposed on a side of the array substrate on which a printed circuit board 60 is provided along the direction of plane on which it is located, namely, a side on which a peripheral region 12 as shown in FIG. 1*a* and FIG 1*b* is located. The glue dispensing zone 30 is disposed on a side on which a printed circuit board is located, and as compared to other side of the array substrate, the length of an electrostatic lead-out line can be decreased, so that the resistance of the electrostatic lead-out line is decreased. For example, in FIG. 1*b*, a glue dispensing zone 30 is provided in a peripheral region 12, and an electrostatic lead-out line only travels through the peripheral region 12, and as compared with the case where a glue dispensing zone is provided in a peripheral region 13 or 14 and it is necessary to travel through the peripheral region 13 or 14 and a peripheral region 12, the length of the electrostatic lead-out line can be effectively shortened in this way. Furthermore, in embodiments of the disclosure, by means of arranging a glue dispensing zone 30 on a side of the array substrate with a printed circuit board 60 provided thereon, the array substrate provided with the glue dispensing zone can adopt a variety of modes such as GOA (as shown in FIG. 1a), COF (as shown in FIG. 1b) and so on, and thus it has a better versatility.

As shown in FIG. 1a and FIG. 1b, on a data signal input side (i.e., the side on which a peripheral region 12 is located) of the array substrate 100, there is further provided a Pad zone, namely, a zone where a variety of signal lines of the array substrate are press-bonded to external lead wires of a drive circuit board. In order to prevent the signal lines and electrode pins 20 from being corroded by water vapor, a UV glue 21 (i.e., an ultraviolet curable glue) is usually coated in the Pad zone, and covers the signal lines and the electrode pin 20. In an embodiment of the disclosure, when conductive adhesive 90 is electrically connected to a printed circuit board through an electrostatic lead-out line 40, the UV glue 21 may cover a portion 42 of the electrostatic lead-out line 40 situated outside the glue dispensing zone 30 as well, as shown in FIG. 1a and FIG. 1b, so as to prevent it from being corroded by water vapor or being scratched. If a glue dispensing zone is located in the middle portion of a peripheral region 12, during the course of coating a UV glue with an automatic glue dispensing equipment, a probe needs to be lifted and the glue coating process is interrupted so as to prevent the glue dispensing zone from being covered by the UV glue, this results in the fact that UV glue cannot be coated continuously, and in turn, coating efficiency of the UV glue is reduced. In order to ensure that the glue dispensing zone 30 does not make an impact on coating of the UV glue, and the UV glue can be coated continuously, thereby saving the time for coating UV glue with the automatic glue dispending equipment. In at least one embodiment, a glue dispensing zone 30 may be located at vertex angle of an array substrate 100, that is, the glue dispensing zone 30 is disposed at an end of the peripheral region 12. Each of FIG. 1a and FIG. 1b has been illustrated with reference to an example in which two glue dispensing zones 30 are disposed at the location where vertex angles α and β of the array substrate 100 are located, respectively.

Figure 4A:
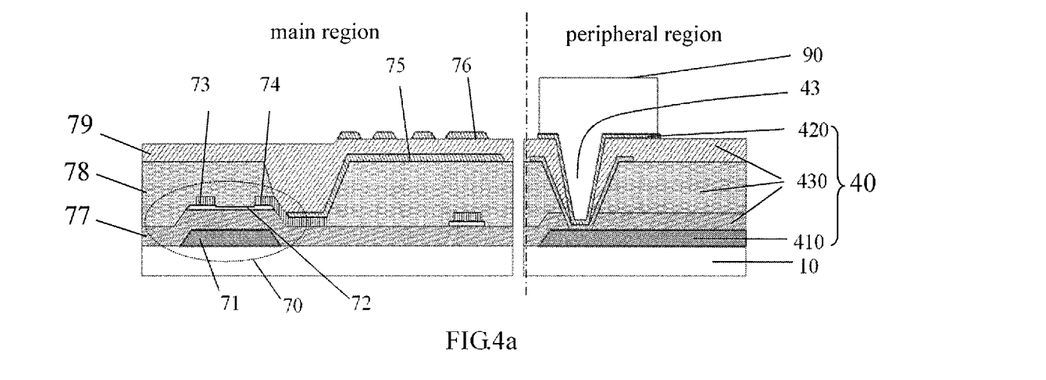
FIG. 4a is a schematic section view illustrating an array substrate in a display panel provided by an embodiment of the disclosure.
Figure 4B:
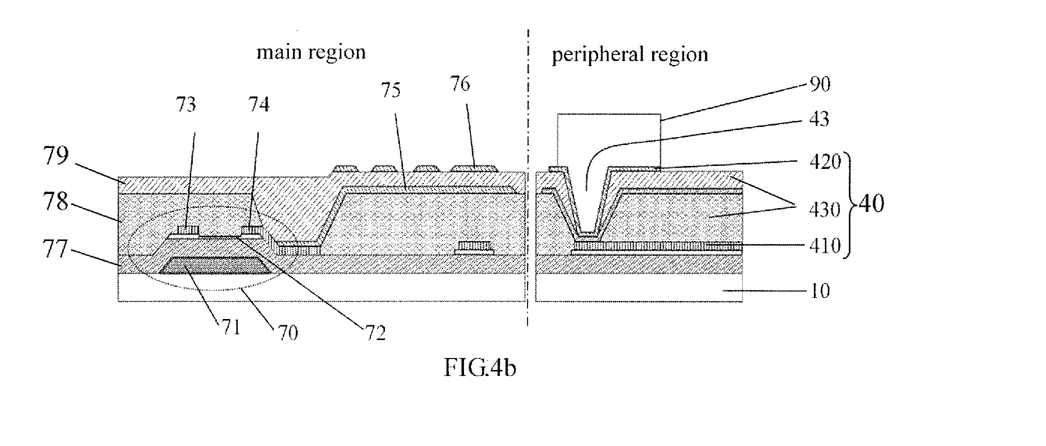
FIG. 4b is a schematic section view illustrating another array substrate in a display panel provided by an embodiment of the disclosure.
Figure 4C:
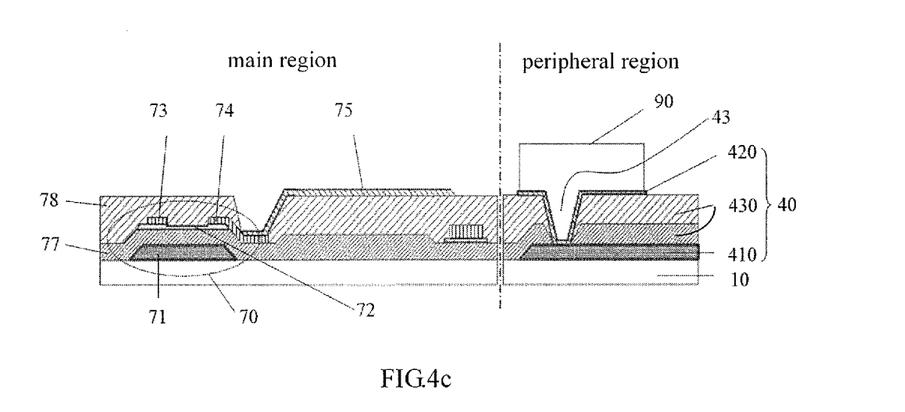
FIG. 4c is a schematic section view illustrating still another array substrate in a display panel provided by an embodiment of the disclosure.

Hereinafter, an electrostatic lead-out line 40 in embodiments of the disclosure will be described in detail by taking a liquid crystal display panel as an example in conjunction with FIG. 4a, FIG. 4b and FIG. 4c As shown in FIG. 4a, FIG. 4b and FIG. 4c, a gate electrode 71, a gate insulating layer 77, an active layer 72 and source/drain electrodes 73, 74 of a thin film transistor 70, a passivation layer 78, and a pixel electrode 75 may be sequentially disposed on a base substrate of an array substrate 100, and the pixel electrode 75 is electrically connected to the drain electrode 74 of the thin film transistor through a via hole in the passivation layer 78.

Along the direction of the plane on which the array substrate is located, the electrostatic lead-out line 40 includes a portion 41 situated in a glue dispensing zone 30 and a portion 42 situated outside the glue dispensing zone 30, as shown in FIG. 1a and FIG. 1b; along the direction perpendicular to the plane on which the array substrate 100 is located, the electrostatic lead-out line 40 includes a first conductive part 410, as shown in FIG. 4a, FIG. 4b and FIG. 4c. For example, the first conductive part 410 may be disposed in the same layer as an electrode in the array substrate. In this way, the first conductive part 410 of the electrostatic lead-out line 40 can be formed when the electrode in the array substrate is formed by one patterning process, so as to omit a patterning process necessary for separately forming an electrostatic lead-out line. Thus, the process flow is simplified.

The thin film transistor 70 is disposed in a main region of the array substrate, and includes the gate electrode 71, the active layer 72, the source electrode 73 and the drain electrode 74. Because the gate electrode 71 and source/drain electrodes 73, 74 are made of a metal, such as aluminum, copper, molybdenum or other metal, and the resistance of the metal is relatively smaller, in at least one embodiment, the first conductive part 410 of the electrostatic lead-out line 40 can be disposed in the same layer as the gate electrode 71, as shown in FIG. 4a and FIG. 4c; or, the first conductive part 410 may be disposed in the same layer as source/drain electrodes 73, 74, as shown in FIG. 4b. That is, the above electrode in the array substrate is a gate electrode or source/drain electrodes.

It is to be noted that, based on the position of a gate electrode, thin film transistors 70 may be classified into a top-gate type (i.e., a gate electrode 71 is located on a side of an active layer 72 far away from a base substrate 10) and a bottom-gate type (i.e., a gate electrode 71 is located on a side of an active layer 72 facing a base substrate 10, as shown in FIGS. 4a, 4b and 4c); based on the contact mode of source/drain electrodes 73, 74 and an active layer 72, thin film transistors 70 can be classified into a top contact type (i.e., source/drain electrodes 73, 74 are located on a side of the active layer 72 far away from a base substrate 10, as shown in FIGS. 4a, 4b and 4c) and a bottom contact type (i.e., source/drain electrodes 73, 74 are located on a side of the active layer 72 facing a base substrate 10). In an embodiment of the disclosure, in order to prevent a first conductive part 410 of an electrostatic lead-out line 40 from being disconnected, the first conductive part 410 of the electrostatic lead-out line 40 may be arranged near a base substrate 10. Therefore, the thin film transistor is preferably of a bottom-gate type and/or a bottom-contact type in embodiments of the disclosure.

In addition, a gate signal line in the array substrate is connected to the gate electrode, and a data signal line is connected to source/drain electrodes, and so, the first conductive part 410, the gate electrode 71 and the gate signal line can be formed in the same patterning process. Or, the first conductive part 410, source/drain electrodes 73, 74 and the data signal line can be formed in the same patterning process.

In order to prevent an electrostatic lead-out line 40 from being corroded by water vapor, as shown in FIG. 4c, the electrostatic lead-out line 40 may further include an insulating layer 430 covering the first conductive part 410. In addition, in order to further protect the first conductive part 410, the electrostatic lead-out line 40 may further include a second conductive part 420, which is electrically connected to the first conductive part 410 through a plurality of via holes 43 (i.e., a plurality of via holes 43 passing through the insulating layer 430) in the insulating layer 430. For example, the second conductive part 420 may be made of indium tin oxide, indium zinc oxide, indium gallium zinc oxide or other transparent conductive material, and this can play a role in preventing the oxidation of the first conductive part 410. Moreover, the contact area between the first conductive part 410 and the second conductive part 420 can also be increased by using multiple via holes 43, and thus resistance of the whole electrostatic lead-out line 40 is decreased. It can be understood by those skilled in the related art that, the greater the number of via holes 43 in the insulating layer 430 is, the larger the contact area between the first conductive part 410 and the second conductive part 420, and the smaller the resistance of the whole electrostatic lead-out line 40 is.

In an embodiment of the disclosure, the insulating layer 430 may be formed of the material for a gate insulating layer 77 or a passivation layer 78 in the main region, etc. For example, as shown in FIG. 4c, after the first conductive part 410 of the electrostatic lead-out line 40 is formed by using a gate metal layer for formation of the gate electrode 71, in the course of forming a gate insulating layer 77, a gate insulating layer material is made to cover the first conductive part 410 besides; in the course of forming an active layer on the gate insulating layer 77, an active layer material on the first conductive part 410 on which the gate insulating layer material is formed is etched; in the course of forming source/drain electrodes 73, 74 on the active layer 72, a source/drain metal layer formed on the first conductive part 410 is etched; in the course of forming a passivation layer on source/drain electrodes and a passivation layer via hole, a passivation layer material is made to cover the first conductive part 410 on which the gate insulating layer material is formed besides and a via hole 43 is formed, thereby forming an insulating layer 430 of the electrostatic lead-out line 40 and the via hole 43 in the insulating layer 430. At this time, the via hole 43 runs through the gate insulating layer material and the passivation layer material so as to expose a part of the first conductive part 410, so that a second conductive part 420 formed on it can be electrically connected to the first conducive part 410.

It is to be noted that, according to actual situations, the insulating layer 430 is not limited to the case that it is formed of the material for the gate insulating layer 77 or the passivation layer 78 in the main region.

For example, in the case where the first conductive part 410 in FIG. 4c is disposed in the same layer as source/drain electrodes 73, 74, namely, the first conductive part 410 is disposed on the gate insulating layer 77, the insulating layer 430 may also be formed of a material for the passivation layer 78 in the main region.

For example, as shown in FIG. 4b, the first conductive part 410 of the electrostatic lead-out line 40 is disposed in the same layer as source/drain electrodes 73, 74, and thus the material for an insulating layer 430 formed between the first conductive part 410 and the second conductive part 420 may not include the material for the gate insulating layer 77.

In at least one embodiment, the second conductive part 420 of the electrostatic lead-out line 40 may be disposed in the same layer as a pixel electrode 75 in the main region of the array substrate, as shown in FIG. 4c. As such, in the course of forming the pixel electrode 75 on the passivation layer 78, the pixel electrode 75 and the second conductive part 420 may be formed simultaneously with one patterning process.

In addition, with respect to a display panel in a horizontal electric field mode, a common electrode 76 may further be provided in the array substrate, as shown in FIG. 4a and FIG. 4c. Therefore, in at least one embodiment, the second conductive part 420 may be disposed in the same layer as the common electrode 76 as well.

FIG. 4a and FIG. 4b will be illustrated with reference to an example in which a pixel electrode 75 is located between a common electrode 76 and a base substrate 10, and in this case, during formation of the pixel electrode 75 on a passivation layer, a portion of a pixel electrode material situated in a peripheral region can be retained and this portion of pixel electrode material is made to be electrically connected to a first conductive part 410 through a via hole 43; in the course of forming an insulating layer 79 between the pixel electrode 75 and the common electrode 76, a hole forming process is carried out on a portion of the insulating layer 79 corresponding to the via hole 43 in the insulating layer 430 so as to expose a portion of the pixel electrode material electrically connected to the first conductive part 410; in the course of forming the common electrode 76 above the insulating layer 79, the common electrode 76 and a second conductive part 420 may be formed simultaneously in same one patterning process, so that the second conductive part 420 is electrically connected to the first conductive part 410 through the pixel electrode material left in the via hole 43. Certainly, during formation of the pixel electrode 75, a portion of the pixel electrode material situated in a peripheral region may also be etched, and in an electrostatic lead-out line 40 formed in this case, a second conductive part 420 is electrically connected to a first conductive part 410 directly.

In the above embodiment of the present, the pixel electrode 75 and the common electrode 76 are transparent electrodes, and are usually made of a transparent metal oxide, such as ITO (indium tin oxide) or the like.

It is to be noted that, embodiments of the disclosure do not place a limitation on the positional relationship of a pixel electrode 75 and a common electrode 76 in the array substrate. For example, the pixel electrode 75 may be located on a side of the common electrode 76 facing a base substrate 10, as shown in FIG. 4a and FIG. 4b; for example, the pixel electrode 75 may also be located on a side of the common electrode 76 far away from a base substrate 10.

As to an array substrate that includes a pixel electrode 75 and a common electrode 76 together, FIG. 4a and FIG. 4b have been presented merely with reference to an example in which a second conductive part 420 and a common electrode are disposed in the same layer. According to actual situations, a second conductive part 420 of an electrostatic lead-out line 40 may be formed with a pixel electrode 75 and a common electrode 76.

FIG. 4a, FIG. 4b and FIG. 4c only exemplarily shows the case that conductive adhesive 90 is electrically connected to an electrostatic lead-out line 40 after it is dripped into a via hole 43, and their shape does not reflect the true scale.

In embodiments of the disclosure, the structure that a second conductive part 420 of an electrostatic lead-out line 40 is electrically connected to a first conductive part 410 through a plurality of via holes 43 in an insulating layer 430 may be mainly related to the portion 41 of the electrostatic lead-out line 40 situated in a glue dispensing zone 30, an insulating-layer via hole and a second conductive part may not be provided on a portion 42 of the electrostatic lead-out line 40 situated outside the glue dispensing zone 30.

Additionally, as for an OLED display panel, a first conductive part of an electrostatic lead-out line may also be formed simultaneously with a gate electrode or source/drain electrodes of a thin film transistor included by an array substrate (namely, they are disposed in the same layer), and an insulating layer covering the first conductive part may also be formed of a gate insulating layer of the thin film transistor or a passivation layer. Certainly, according to actual situations, a first conductive part and an insulating layer that covers the first conductive part may be formed by using other conductive structure or insulating layer on the array substrate in the OLED display panel as well; accordingly, a second conductive part may be formed by using a transparent conductive layer on the array substrate in the OLED display panel as well. Embodiments of the disclosure will not be described in detail in this regard.

In order to obtain a better alignment precision when conductive adhesive is dripped into a glue dispensing zone by an automatic glue-dispensing equipment, in at least one embodiment, an alignment mark may be formed in the glue dispensing zone. Because a portion 41 of an electrostatic lead-out line 40 situated in the glue dispensing zone 30 and a gate electrode and/or source/drain electrodes are formed simultaneously, namely, they are formed by using the same metallic (e.g., magnesium, aluminum, copper, titanium or the like) material, and a metal is usually opaque and easy to identify, a first conductive part 410 of the electrostatic lead-out line 40 may be used for forming the alignment mark.

Figure 5:
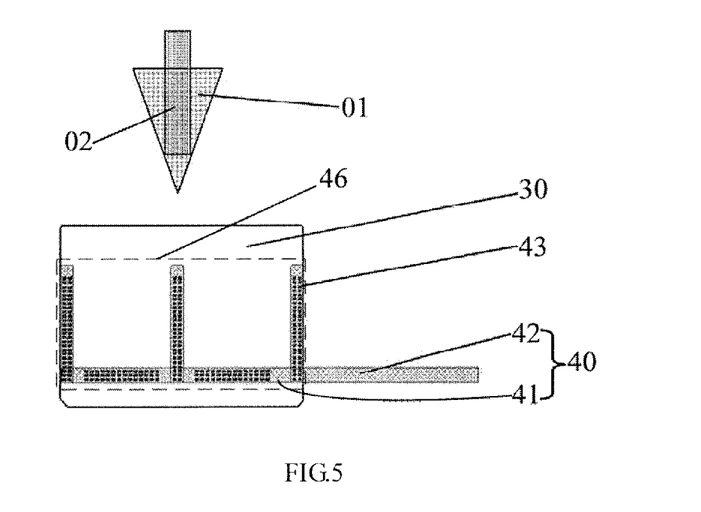
FIG. 5 is a schematic structure view illustrating dripping of conductive adhesive onto an alignment mark with an automatic glue-dispensing equipment, provided by an embodiment of the disclosure.

FIG. 5 is a schematic structure view illustrating dripping of conductive adhesive onto an alignment mark with an automatic glue-dispensing equipment provided by an embodiment of the disclosure. In FIG. 5, conductive adhesive is installed within a conical probe 01 of the glue dispensing equipment, during dispensing the conductive adhesive, an alignment mark 46 in a glue dispensing zone 30 can be read by a detecting device 02 of the glue dispensing equipment. Due to the fact that when a second conductive part 420 of an electrostatic lead-out line 40 and an insulating layer 430 are made of a transparent material, the pattern of the alignment mark formed by a first conductive part 410 can be seen clearly under strong light irradiation, the pattern of the alignment mark can be smoothly read and utilized by the glue dispensing equipment to achieve functions of calibration feedback, coarse alignment, and fine alignment.

FIG. 5 shows the case where an alignment mark in a shape of Chinese character "山" is formed by a first conductive part 410 of an electrostatic lead-out line 40. With reference to an example in which a bottom-gate thin film transistor is formed in an array substrate, the manufacturing process of pattern of an alignment mark is conducted such as follows: an electrostatic lead-out line 40 is formed with a gate metal layer while a gate electrode is formed, so that pattern of a first conductive part 410 of the electrostatic lead-out line 40 corresponding to a portion 41 in a glue dispensing zone 30 is the shape of Chinese character "山".

Figure 6A:
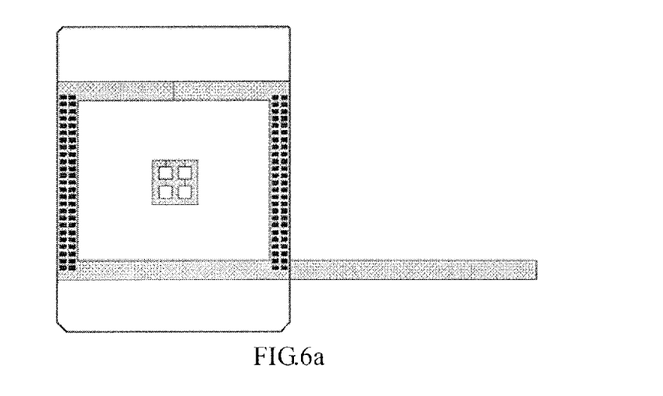
FIG. 6a is a schematic top view illustrating an alignment mark provided by an embodiment of the disclosure.
Figure 6B:
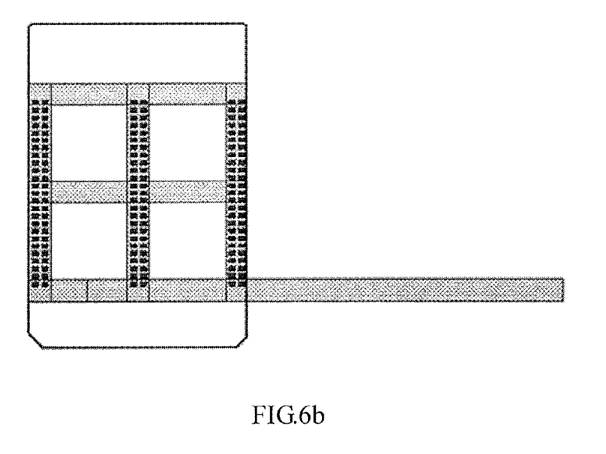
FIG. 6*b* is a schematic top view illustrating an alignment mark provided by an embodiment of the disclosure.

FIG. 5 was illustrated merely with a shape of Chinese character "山" as an example, FIG. 6a will be illustrated with the combination of a shape of Chinese character "田" and a shape of Chinese character "口" as an example, and FIG. 6b will be illustrate with a shape of Chinese character "田" as an example. However, embodiments of the disclosure are not limited thereto, and in at least one embodiment, pattern of an alignment mark may include at least one of a "山" shape, a "田" shape, a "回" shape, and a "口" shape as well as a "◆" shape and a "●" shape or a combination thereof. The only consideration is that the alignment mark can be smoothly read by a detecting device of a glue dispensing equipment, so that functions of calibration feedback, coarse alignment and fine alignment can be realized by the glue dispensing equipment with the aid of the pattern of the alignment mark.

As shown in FIG. 2a and FIG. 2b, a sealant 300 is provided between a counter substrate 200 and an array substrate 100, and a glue dispensing zone 30 is arranged on an outer side of the sealant 300 (i.e., the left side of the sealant 300 in FIG. 2a and FIG. 2b). In at least one embodiment, an end of a black matrix 203 in the counter substrate 200 located on an inner side of the sealant 300 may be situated in the sealant 300 (as shown in FIG. 2a and FIG. 2b) or located on an inner side of the sealant 300; and/or, an end of a signal line 80 (e.g., a gate signal line, a data signal line) in the array substrate 100 located on an inner side of the sealant 300 may be situated in the sealant 300 or located on an inner side of the sealant 300.

Because liquid droplets of the conductive adhesive coated in a glue dispensing zone has an irregular shape, their outer surface approximates to an elliptic shape due to the surface tension, and owing to infiltrating function of the conductive adhesive before solidification, the conductive adhesive 90 tends to intrude into the signal line 80 and the layer in which the black matrix 203 on the counter substrate 200 is located, which may bring about crosstalk between the signal line and static electricity as well as charge accumulation on the black matrix layer. In view of this, in an embodiment of the disclosure, by means of compressing a black matrix layer included by a counter substrate inside a display device into a sealant 300 or to an inner side of the sealant 30, occurrence of the following case can be avoided: electrostatic accumulation on the black matrix layer is caused by contact of the black matrix layer with the conductive adhesive 90, and in turn, deflection of pixel liquid crystals of the whole display screen is affected. In an embodiment of the disclosure, by compressing a signal line in an array substrate into a sealant 300 or to an inner side of the sealant 300, the following case is avoidable: the signal line is exposed directly due to lack of UV glue coverage in the place of the conductive adhesive 90 and is corroded by water vapor.

According to at least one embodiment of the disclosure, there is further provided a display device, which includes the display panel as provided in any of the above embodiments. For example, the display device is a liquid crystal display device, and it may further include a backlight source for providing the display panel with backlight, and polarization sheets located on both sides of the display panel.

For example, the display device provided by embodiments of the disclosure may be a liquid crystal panel, an electronic paper, an OLED panel, a touch panel, a cell phone, a tablet computer, a television, a display, a notebook computer, a digital photo frame, a navigator or any other product or component having a display function.

According to at least one embodiment of the disclosure, there is further provided a manufacturing method of a display panel including that, a counter substrate is formed, with an electrostatic conducting structure provided on the counter substrate; an array substrate that includes a main region and a peripheral region is formed, the main region coinciding with the orthographic projection of the counter substrate on the array substrate, and at least one glue dispensing zone being arranged in the peripheral region or the main region; the array substrate and the counter substrate are cell-assembled; and conductive adhesive is dripped in the glue dispensing zone, so that the electrostatic conducting structure and a grounded unit are electrically connected by the conductive adhesive.

Embodiments of the disclosure are not limited in the mode in which conductive adhesive is dripped in a glue dispensing zone, and the conductive adhesive may be dripped in the glue dispensing zone manually, and may also be dripped in the glue dispensing zone by an automatic equipment.

In at least one embodiment, the grounded unit may be a printed circuit board arranged on an array substrate, and in this case, the step of forming the array substrate includes forming an electrostatic lead-out line in a peripheral region of the array substrate, so that the electrostatic lead-out line includes a portion situated in a glue dispending zone and a portion situated outside the glue dispensing zone and electrically connected to the printed circuit board; the step of dripping conductive adhesive in a glue dispensing zone includes allowing the conductive adhesive to be electrically connected to a portion of an electrostatic lead-out line situated in the glue dispensing zone, so as to achieve electrical connection of the conductive adhesive to the printed circuit board through the electrostatic lead-out line.

In at least one embodiment, the grounded unit may be a metal frame as well, and in this case, the step of cell-assembling the array substrate and the counter substrate includes fixing the array substrate and the counter substrate with a metal frame, and the step of dripping the conductive adhesive in the glue dispensing zone includes making the conductive adhesive be in contact with a surface of the metal frame.

It is to be noted that, in embodiments of the disclosure, there is no limit on the order of the step of forming a counter substrate and the step of forming an array substrate, it is possible that an array substrate is formed earlier and a counter substrate is formed afterwards, and it is also possible that a counter substrate is formed earlier and an array substrate is formed afterwards.

With respect to a display panel with a transparent conductive layer disposed on a side of a counter substrate far away from an array substrate, such as a horizontal electric field type liquid crystal display panel, in at least one embodiment, the electrostatic conducting structure may be the transparent conductive layer disposed on a side of the counter substrate far away from the array substrate.

With respect to a display panel without a transparent conductive layer disposed on a side of a counter substrate far away from an array substrate, such as a vertical electric field type liquid crystal display panel, an OLED display panel or the like, in at least one embodiment, the electrostatic conducting structure may be a first wiring surrounding the periphery of the counter substrate (namely, arranged in the region where at least one side of the counter substrate is located), and the first wiring is located on a side of the counter substrate facing the array substrate or on a side of the counter substrate far away from the array substrate. For example, the first wiring may be formed in the same patterning process as a common electrode or a touch electrode on the counter substrate. The touch electrode may be located on a side of the counter substrate facing the counter substrate, or located on a side of the counter substrate far away from the array substrate.

In at least one embodiment, an electrostatic lead-out line includes first conductive part along the direction perpendicular to the plane on which an array substrate is located, and the first conductive part and a gate electrode or source/drain electrodes in the array substrate are formed in the same patterning process.

In at least one embodiment, an electrostatic lead-out line may further include an insulating layer and a second conductive part that are located on a side of the first conductive part far away from an array substrate, and the second conductive part is electrically connected to the first conductive part through multiple via holes in the insulating layer. For example, the second conductive part may be formed in the same patterning process as a pixel electrode or a common electrode in the array substrate. Embodiments of the disclosure are not limited in the positional relationship of the pixel electrode and the common electrode in the array substrate.

Regarding implementation of the manufacturing method of the display panel provided by embodiments of the disclosure, reference to the above embodiments of the display panel can be made, and redundant description are omitted.

In summary, a display panel and manufacturing method and a display device provided by embodiments of the disclosure possess at least one of the following advantages.

(1) With a glue dispensing zone being arranged in a peripheral region or a main region of the array substrate, conductive adhesive being provided in the glue dispensing region and allowed to be electrically connected to an electrostatic conducting structure on a counter substrate in embodiments of the disclosure, the static electricity on the counter substrate can be conducted out to the conductive adhesive within the glue dispensing zone, and then conducted out to a grounded unit, and consequently, the static electricity in the array substrate and the counter substrate can be conducted out in time, avoiding the electrostatic damage.

(2) As compared with the mode in which an electrically conductive adhesive tape is manually attached, an automatic glue dispensing equipment can be used for dripping conductive adhesive into a glue dispensing zone in embodiments of the disclosure, so that the labor cost and material cost can be saved, and the production efficiency can be enhanced.

(3) A conductive adhesive is electrically connected to a transparent conductive layer on a side of a counter substrate far away from an array substrate, and as a result, the output of static electricity on the counter substrate is realized, and external signals can be further shielded, so as to ensure that an electric field within a liquid crystal cell is uniform, and to guarantee the quality and reliability of products.

(4) With a glue dispensing zone being arranged on a data signal input side of the array substrate, versatility of the array substrate can be raised, so that it is suitable for modes such as COF, GOA and so on; with a glue dispensing zone being arranged at a vertex angle of the array substrate, UV glue can be coated in a Pad zone continuously.

(5) Because a printed circuit board is used as a grounded unit, embodiments of the disclosure are applicable to display devices with a plastic frame.

(6) In the layered structure of an electrostatic lead-out line, an insulating layer that covers a first conductive part and a second conductive part electrically connected to the first conductive part through via holes in the insulating layer are provided, the overall resistance of the electrostatic lead-out line can be decreased, so as to prevent the electrostatic lead-out line being oxidized or corroded by water vapor; moreover, while various film structures in the array substrate are produced, corresponding parts in the layered structure of the electrostatic lead-out line are formed, so that the process flow can be simplified.

(7) An alignment mark is provided in a glue dispensing zone, the pattern of the alignment mark can be smoothly read and utilized by a glue dispensing equipment to achieve functions of calibration feedback, coarse alignment, and fine alignment.

(8) An end of a black matrix in a counter substrate is pressed into a sealant or to an inner side of the sealant, the abnormal deflection of liquid crystals that is caused by the fact that the static electricity accumulates on a black matrix layer owing to its contact with conductive adhesive can be avoided.

(9) An end of a signal line in the array substrate is provided in a sealant or on an inner side of the sealant, the direct contact of conductive adhesive with the signal line can be avoided, so as to prevent the signal line from being exposed and corroded by water vapor.

Descriptions made above are merely exemplary embodiments of the disclosure, but are not used to limit the protection scope of the disclosure. The protection scope of the disclosure is determined by the attached claims.

This application claims the benefit of priority from Chinese patent application No. 201410850811.0, filed on Dec. 31, 2014, the disclosure of which is incorporated herein in its entirety by reference as a part of the present application.

What is claimed is:

1. A display panel, comprising an array substrate and a counter substrate disposed oppositely, wherein,
the array substrate includes a main region and a peripheral region, the main region coincides with an orthographical projection of the counter substrate on the array substrate, at least one glue dispensing zone is arranged in the peripheral region or the main region, and conductive adhesive is provided in the glue dispensing zone and is electrically connected to a grounded unit;
an electrostatic conducting structure is provided on the counter substrate, wherein the electrostatic conducting structure is a first wiring only disposed on a periphery of the counter substrate, and the first wiring is located on a side of the counter substrate facing the array substrate and is in a shape of a line, and the conductive adhesive is electrically connected to the electrostatic conducting structure.

2. The display panel claimed as claim 1, wherein the first wiring and an electrode on the counter substrate are disposed in a same layer and are separated from each other.

3. The display panel claimed as claim 1, further comprising a metal frame, wherein the grounded unit is the metal frame, and the conductive adhesive contacts a surface of the metal frame.

4. The display panel claimed as claim 1, wherein the conductive adhesive is electrically connected to the grounded unit through an electrostatic lead-out line, and the electrostatic lead-out line includes a portion situated in the glue dispensing zone and electrically connected to the conductive adhesive, and includes a portion situated outside the glue dispensing zone and electrically connected to the grounded unit.

5. The display panel claimed as claim 4, wherein the array substrate includes a printed circuit board, and the grounded unit is the printed circuit board.

6. The display panel claimed as claim 5, wherein the glue dispensing zone is arranged on a side of the array substrate with the printed circuit board provided thereon along the direction of the plane on which it is located.

7. The display panel claimed as claim 4, wherein the electrostatic lead-out line includes a first conductive part along the direction perpendicular to the plane on which the array substrate is located, a thin film transistor is provided in the main region of the array substrate and includes a gate electrode and source/drain electrodes, and the first conductive part and the gate electrode or the source/drain electrodes are disposed in a same layer.

8. The display panel claimed as claim 7, wherein the electrostatic lead-out line further includes an insulating layer, and the first conductive part is covered by the insulating layer.

9. The display panel claimed as claim 8, wherein the electrostatic lead-out line further includes a second conductive part, and the second conductive part is electrically connected to the first conductive part through via holes in the insulating layer.

10. The display panel claimed as claim 9, wherein the array substrate further includes a pixel electrode, and the second conductive part and the pixel electrode are disposed in a same layer; or
the array substrate further includes a pixel electrode and a common electrode, and the second conductive part is disposed in a same layer as the pixel electrode or the common electrode.

11. The display panel claimed as claim 7, wherein an alignment mark is provided in the glue dispensing zone.

12. The display panel claimed as claim 11, wherein the alignment mark is formed by the first conductive part.

13. The display panel claimed as any one of claim 11, wherein a pattern of the alignment mark includes at least one of a "山" shape, a "田" shape, a "曰" shape, and a "口" shape as well as a "◆" and a "●" or a combination thereof.

14. The display panel claimed as claim 1, wherein the array substrate includes a printed circuit board, and the glue dispensing zone is arranged on a side of the array substrate with the printed circuit board provided thereon along the direction of the plane on which it is located.

15. The display panel claimed as claim 1, wherein the glue dispensing zone is located at a vertex angle of the array substrate.

16. The display panel claimed as claim 1, wherein an alignment mark is provided in the glue dispensing zone.

17. The display panel claimed as claim 1, further comprising a sealant located between the counter substrate and the array substrate, wherein,
the glue dispensing zone is disposed on an outer side of the sealant; and
the counter substrate includes a black matrix located on an inner side of the sealant, and an end of the black matrix is situated in the sealant or situated on an inner side of the sealant; and/or
the array substrate further includes a signal line, and an end of the signal line is situated in the sealant or situated in an inner side of the sealant.

18. The display panel claimed as claim 1, wherein the array substrate further includes a second wiring disposed on a periphery of the array substrate, and the second wiring is electrically connected to the conductive adhesive or the grounded unit.

19. A display device, comprising the display panel claimed as claim 1.

20. A display panel, comprising an array substrate and a counter substrate disposed oppositely, wherein,
the array substrate includes a main region and a peripheral region, the main region coincides with an orthographical projection of the counter substrate on the array substrate, at least one glue dispensing zone is arranged in the peripheral region or the main region, and conductive adhesive is provided in the glue dispensing zone and is electrically connected to a grounded unit;
an electrostatic conducting structure is provided on the counter substrate, the electrostatic conducting structure is a first wiring disposed on a periphery of the counter substrate, the first wiring is located on a side of the counter substrate far away from the array substrate, the first wiring surrounds the periphery of the counter substrate, and the conductive adhesive covers at least part of the first wiring so as to electrically connect to the electrostatic conducting structure.

21. A display panel, comprising an array substrate and a counter substrate disposed oppositely, wherein,
the array substrate includes a main region and a peripheral region, the main region coincides with an orthographical projection of the counter substrate on the array substrate, at least one glue dispensing zone is arranged in the peripheral region or the main region, an alignment mark is provided in the glue dispensing zone and configured to realize alignment through visible light reflected by itself, conductive adhesive is provided in the glue dispensing zone, is partially overlapped with the alignment mark and is electrically connected to a grounded unit;

an electrostatic conducting structure is provided on the counter substrate, the electrostatic conducting structure is made of metal and the conductive adhesive is electrically connected to the electrostatic conducting structure.

\* \* \* \* \*